United States Patent [19]

Shiraishi et al.

[11] Patent Number: 5,350,485
[45] Date of Patent: Sep. 27, 1994

[54] HIGH-RESOLUTION LITHOGRAPHY AND SEMICONDUCTOR DEVICE MANUFACTURING METHOD

[75] Inventors: Hiroshi Shiraishi; Takashi Soga; Fumio Murai; Toshio Sakamizu, all of Tokyo; Nobuaki Hayashi, Hidaka, all of Japan

[73] Assignees: Hitachi, Ltd.; Hitachi Chemical Co., Ltd., both of Tokyo, Japan

[21] Appl. No.: 9,012

[22] Filed: Jan. 26, 1993

[30] Foreign Application Priority Data

Jan. 28, 1992 [JP] Japan .................. 4-012814

[51] Int. Cl.⁵ .......................... H01L 21/00
[52] U.S. Cl. .................. 156/628; 156/652; 156/655; 156/656; 156/661.1; 430/323; 430/325
[58] Field of Search ........... 156/628, 661.1, 659.1, 156/652, 655, 656; 430/313-318, 323, 325

[56] References Cited

U.S. PATENT DOCUMENTS

| | | | |
|---|---|---|---|
| 3,779,778 | 12/1973 | Smith et al. | 430/270 |
| 4,052,211 | 10/1977 | Inoue et al. | 430/325 |
| 4,252,891 | 2/1981 | Kostyshin et al. | 430/313 X |
| 4,320,191 | 3/1982 | Yoshikawa et al. | 430/313 X |
| 4,506,005 | 3/1985 | Lis | 156/628 X |
| 4,838,989 | 6/1989 | Ashby et al. | 156/628 |
| 5,032,216 | 7/1991 | Felten | 156/628 |
| 5,073,233 | 12/1991 | Banks et al. | 156/656 |
| 5,209,814 | 5/1993 | Felten et al. | 156/628 |

OTHER PUBLICATIONS

Schellekens et al., "Single Level Dry Developable Resist Systems, Based on Gas Phase Silylation", SPIE, vol. 1086, Advances in Resist Technology and Processing VI, 1989, pp. 220-228.

*Primary Examiner*—Thi Dang
*Attorney, Agent, or Firm*—Fay, Sharpe, Beall, Fagan, Minnich & McKee

[57] ABSTRACT

A lithographic method for forming a mask pattern is useful for etching wiring or insulator layers on a substrate. A catalyst generation layer and a latent image formation layer are formed on the target layer prior to application of actinic radiation to activate a catalyst in the catalyst generation layer in accordance with a predetermined pattern. The activated catalyst diffuses into the latent image formation layer to form a latent image, which then serves as a mask pattern for etching the catalyst generation layer, latent image formation layer and target layer. The catalyst generation layer may be formed prior to the latent image formation layer, or vice versa. In another embodiment, the catalyst generation layer is formed prior to the radiation step, but the latent image formation layer is formed after application of the actinic radiation.

37 Claims, 9 Drawing Sheets

HIGH-RESOLUTION LITHOGRAPHY AND SEMICONDUCTOR DEVICE MANUFACTURING METHOD

BACKGROUND OF THE INVENTION

1. Field of the Invention

The present invention relates generally to the manufacture of semiconductor devices, and, more particularly, to a high-resolution lithographic method for the microfabrication of semiconductor devices.

2. Description of the Related Art

The continuing need for higher-integration and higher-density semiconductor devices has resulted in a variety of improvements relating to the method of pattern transfer, which is mainly based upon microlithography, for forming micron- or submicron-order fine patterns in electronic devices such as semiconductor devices.

One of these improvements is the so-called surface-imaging method, which uses an image of the highest quality as a resist pattern on the exposure surface of a photoresist. An example of this method is described in Schellekens et al, "Single Level Dry Developable Resist Systems, Based on Gas Phase Silylation." *SPIE, Vol. 1086, Advances in Resist Technology and Processing VI* (1989), pp. 220-228. In this example, deep ultraviolet radiation is applied to a desired portion of a chemical amplification resist layer, and then the portion of the resist layer is heated to cross-link it. Then, those portions of the resist layer to which deep ultraviolet radiation is not applied are silylated. Afterward, the resist is dry-etched by using the silylated portion as a mask to form a resist pattern.

This method has proven generally effective because of the structure of the chemical amplification resist layer. The chemical amplification resist layer comprises a single pattern-forming layer material for producing a catalyst in latent image-forming portion of the resist by applying actinic radiation, such as ultraviolet radiation, in accordance with a pattern, thus causing the solubilities of radiation-applied and nonradiation-applied portions of the latent image-forming portion to differ from each other. The catalyst encourages the reaction that results in the latent image pattern being formed in the latent image-forming portion.

Because the silylated portion is formed in an exposure surface with the highest image quality, a two-dimensional image of the silylated portion is transferred to the resist pattern. As a result, the influence of the exposure profile in the film-thickness direction is small compared with that of the ordinary resist pattern-forming methods, in which development is performed in accordance with a three-dimensional exposure state. That is, the lateral line of the pattern profile is a straight line approximately vertical to the bottom surface of the resist layer. Therefore, transformation of the pattern profile is reduced.

Thus, the conventional surface imaging methods allow the accurate dry etching of step substrates and other types of substrates, and also hybrid lithography, using a plurality of radiation sources. However, the conventional methods require batch processing for silylation. This is a disadvantage in industrial production, which is based on continuous processing.

SUMMARY OF THE INVENTION

The present invention assigns two functions to the chemical amplification resist: a catalyst generating function, and a latent image-forming function. These functions are performed by providing the chemical amplification resist as a double-layered resist. That is, a first layer is provided for generating the catalyst, and a second layer is provided for forming the latent image. By generating the catalyst in the catalyst generation layer through irradiation of actinic radiation, so that the catalyst diffuses into the latent image formation layer, a latent image is formed as a result of the reaction encouraged by the catalyst, which image can be developed to obtain the desired lithographic mask pattern.

In accordance with the invention, only the catalyst generation layer must be formed before irradiation with the actinic radiation. In alternate embodiments, the latent image formation layer can either be formed prior to the irradiation, or after the irradiation. When formed before the irradiation, the catalyst generation layer and the latent image-formation layer may be formed in any order (i.e., the catalyst generation layer may be formed on the latent image formation layer, or vice versa). Of course, if the latent image formation layer is formed after the irradiation, the latent image formation layer is formed on the catalyst generation layer.

DETAILED DESCRIPTION OF THE PREFERRED EMBODIMENTS

Figure 1:
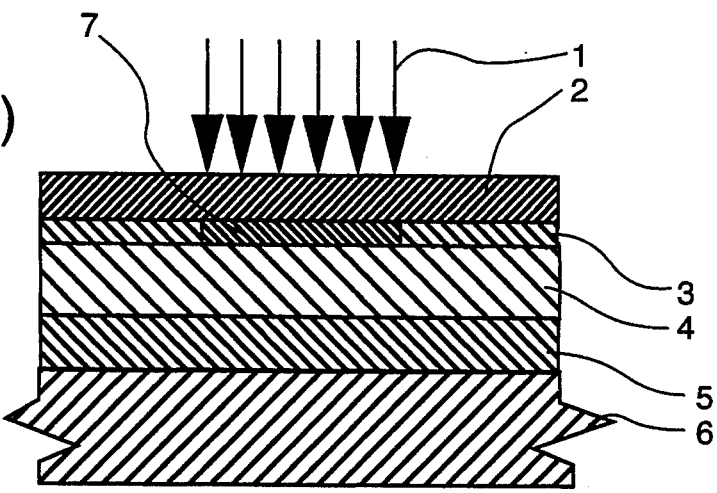
FIGS. 1(a)-1(e) is a process sectional view of Embodiments 1 and 6 of the present invention for forming a wiring layer of a silicon semiconductor device by using an electron beam drawing technique.
Figure 1:
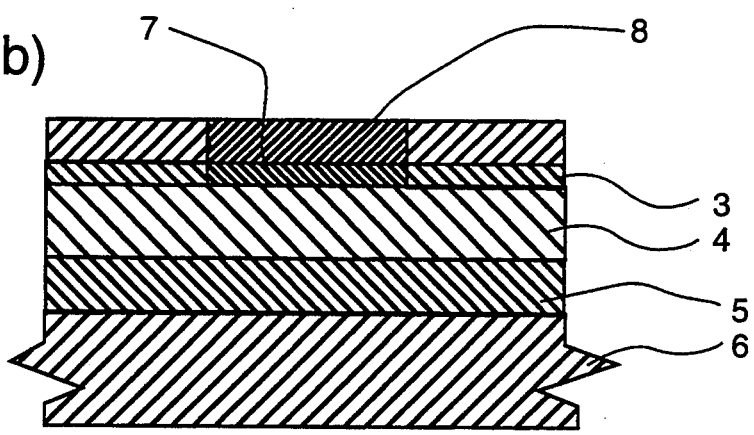
Figure 1:
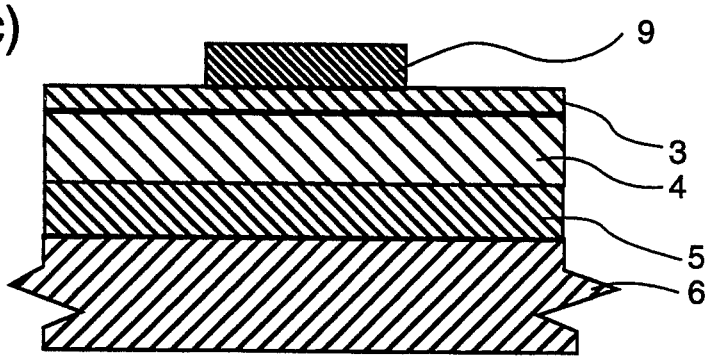
Figure 1:
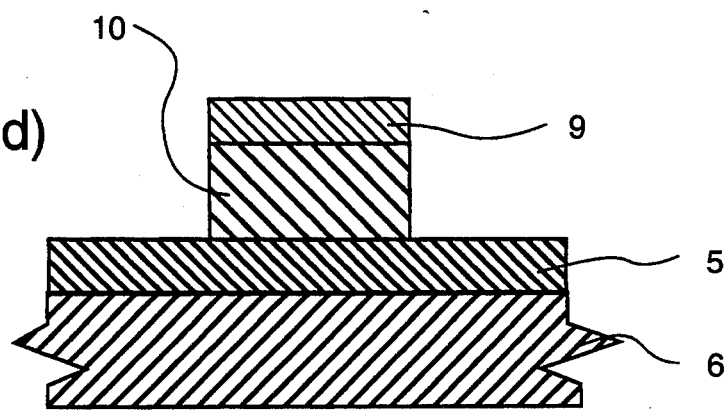
Figure 1:
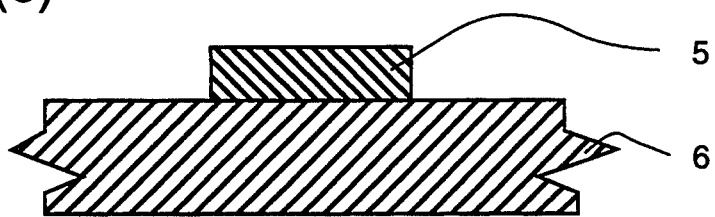

In each of the specific embodiments described below for the purpose of illustrating the invention, the masked-/etched semiconductor device has one or more of the following basic elements formed on the substrate: metal wiring layer (etching target), insulator layer (etching target), catalyst generation layer and latent image formation layer. Suitable materials for each of these elements are as follows:

metal wiring layer: any of various types of metals useful for forming gate electrodes and wires, such as aluminum and its alloys, tungsten, molybdenum, and polycrystalline silicon;

insulator layer: an organic resin including polyimide, silicon dioxide films formed through CVD method or thermal oxidation method, coating glass films, and silicon-nitride films;

catalyst generation layer: a thermal cross-linking organic resin layer including an acid generator whose thermal decomposition temperature is higher than the thermal cross-linking temperature of the organic resin layer; a material composed of a coating glass material, obtained from solution, and an acid generator having a relatively high thermal decomposition temperature. The acid generator may be an onium salt having a relatively high thermal decomposition temperature, or more particularly a nonmetallic onium such as triphenylsulfonium triflate, diphenyliodonium triflate, di-t-butyl-phenyliodonium triflate, and triphenylsulfonium tosilate (preferred for embodiments in which the catalyst generation layer is between the substrate and the latent image formation layer and when dry-etching using an etching medium including oxygen plasma is performed). Catalytic reactions include various types of acid-catalyzed reactions. For example, acid-catalyzed cross-linking reactions using a compound having a methylol group or an alcoxymethyl group, epoxy resin, polyhydric alcohol, or aldehyde as the cross-linker, acid-catalyzed condensation of silanols, and acid-catalyzed liberation of a compound having an acid-labile group such as t-butoxycarbonyloxy or acetal group.

latent image formation layer: any of the chemical amplification resists disclosed in, for example, Smith et al U.S. Pat. No. 3,779,778; JP Patent Nos. 62-39420 and 62-39421; and JP Laid-Open Nos. 59-45439; 62-164045; 60-37549 and 2-129642; an acid precursor for producing an acid through the irradiation of actinic radiation; and compositions excluding substances related to the function of generating catalysts (such as a photo-acid generator). When the material to be etched is an organic resin layer, the latent image formation layer preferably contains a resin component capable of generating a metallic oxide by the action of an etching medium including oxygen plasma used for dry-etching the organic resin layer. The resin component may include, for example, a silicone resin such as a siloxane-based polymer or a silsesquioxane-based polymer. When the material to be etched is a metal capable of serving as a wiring layer or electrode in a semiconductor device, such as Al, an Al alloy, tungsten, molybdenum, or polycrystal silicon, or is an insulator layer of silicon dioxide or silicon nitride, the latent image formation layer preferably includes an organic resin component that is resistant to an etching medium including fluorine plasma or the like used for dry-etching the metal or insulator layer.

EMBODIMENT 1

Embodiment 1 will be described with reference to FIGS. 1(a)-1(e), in which the lithographic technique of the present invention was applied to a process for forming a wiring layer for a silicon semiconductor device, using an electron-beam drawing technique. In this embodiment, the catalyst generation layer and the latent image formation layer were both formed prior to the irradiation of actinic radiation, with the latent image formation layer being formed on the catalyst generation layer.

In this embodiment, an aluminum film (thickness 0.7 $\mu$m) was formed as a wiring layer 5 on a silicon semiconductor substrate 6. Radiation-conductive resist RE-3960B (an industrial product made by Hitachi Chemical Co., Ltd.) was then applied to wiring layer 5, and the resulting intermediate product was baked at 180° C. for five minutes to form a bottom resist layer 4 of thickness 1.6 $\mu$m.

Then, bottom resist layer 4 was coated with a solution prepared by dissolving a composition of about 7 wt. % solid concentration comprising 80 parts by weight of cresol novolak resin, 15 parts by weight of 3-substituted ester of tri-hydroxybenzophenone and o-naphtoquinonediazidosulfonic acid as a thermal cross-linking agent, and 5 parts by weight of triphenylsulfonium triflate and 2-ethoxyethyl acetate by using a spin-coating method. The resulting intermediate product was then baked at 180° C. for ten minutes to form a catalyst generation layer 3 of thickness 0.15 $\mu$m.

Thereafter, the catalyst generation layer 3 was coated with a solution made by dissolving a composition of about 20 wt. % solid concentration comprising 90 parts by weight of polyhydroxybenzylsilsesquioxane, which has an alkali-soluble silicon resin, and ten parts by weight of diphenylsilanediol in 2-ethoxyethyl acetate by using the spin-coating method. The resulting intermediate produce was baked at 80° C. for ten minutes to form a latent image formation layer 2 of a thickness 0.3 $\mu$m.

Then, a predetermined pattern was drawn on the thus-formed sample by applying an electron beam 1 to the material from the side of the latent image formation layer 2 with an electron-beam drawing apparatus. A catalyst thus generated in catalyst generating portion 7 of catalyst generation layer 3 diffused into latent image formation layer 2 in accordance with the predetermined pattern shape. For this embodiment, the acceleration voltage of the electron beam drawing apparatus was set to 30 kV and the electron beam exposure was set to 12 microcoulombs/cm$^2$ (see FIG. 1(a)).

The sample was finally baked at 90° C. for ten minutes to diffuse the catalyst into the latent image formation layer 2 from the catalyst generating portion 7, to accelerate the latent image forming reaction in the latent image formation layer 2. Thus, a latent image 8 corresponding to the pattern shape was formed (see FIG. 1(b)).

The latent image formation layer 2 was then developed using a tetramethylammonium hydroxide aqueous solution (concentration 1.5 wt. %) to obtain developed pattern 9 (see FIG. 1(c)).

Then, catalyst generation layer 3 and bottom resist layer 4 were etched using an oxygen reactive ion etching by using develop pattern 9 as a mask to obtain an organic resin resist pattern 10 (FIG. 1(d)).

Finally, aluminum wiring layer 5 was dry-etched by using the resist pattern as an etching mask (see FIG. 1(e)). Consequently, a fine wiring pattern having a satisfactory aspect ratio was formed.

EMBODIMENT 2

Embodiment 2 will be described with reference to FIGS. 2(a)-(e). In this embodiment, the lithography technique of the invention was applied to a process for forming a wiring layer of a silicon semiconductor device using a deep ultraviolet ray exposure technique. The radiation source was a KrF excimer laser having a wavelength of 248 nm. Both the catalyst generation layer 204 and latent image formation layer 202 were formed before the irradiation, with the latent image formation layer 202 being formed on the catalyst generation layer 204. Thus, latent image formation layer 202 was closest to the radiation source.

Turning to FIGS. 2(a)-(e), aluminum film 205 of thickness 0.7 μm was formed on silicon semiconductor substrate 206. Then, aluminum film 205 was coated with a solution made by dissolving a composition of about 30 wt. % solid concentration of 70 parts by weight of cresol novolak resin, 15 parts by weight of 3-substituted ester of trihydroxybenzophenone and o-naphtoquinonediazidosulfonic acid as a thermal cross-linking agent, and 15 parts by weight of 1,3,5-tris-2,3-dibromo-1-propyl-1,3,5-triazine-2,4,6-(1H,3H,5H)-trione in 2-ethoxyethyl acetate by using a spin-coating method. The sample was then baked at 230° C. for six minutes to form a catalyst generation layer 204 having a thickness of 2.5 μm. Catalyst generation layer 204, as seen below, further served as a bottom resist layer.

Thereafter, catalyst generation layer 204 was coated with coating glass and baked at 200° C. for six minutes to form an intermediate layer 203 having a thickness of 0.1 μm. Then, intermediate layer 203 was coated with a solution made by dissolving a composition of about 20 wt. % solid concentration comprising 80 parts by weight of cresol novolak resin and 20 parts by weight of hexamethoxymethylmelamine in 2-ethoxyethyl acetate by using a spin-coating method, and by baking the resulting sample at 80° C. for ten minutes to form a latent image formation layer 202 of thickness 0.3 μm.

Deep ultraviolet radiation 201 was applied to the thus-formed sample from the side on which the latent image formation layer 202 was exposed by using a KrF excimer laser stepper to form a predetermined pattern of an activated catalyst in catalyst generating portion 207 of the catalyst generation layer 204. In this case, the energy of irradiation of deep ultraviolet radiation was 20 mJ/cm$^2$ (see FIG. 2(a)).

The resulting sample was baked at 90° C. for ten minutes to diffuse the catalyst from the catalyst generating portion 207 through the intermediate layer 203 into the latent image formation layer 202, to accelerate the latent image forming reaction in the latent image formation layer 202. Accordingly, a latent image 8 corresponding to the pattern shape was formed. The latent image formation layer 202 was then developed using a tetramethylammonium hydroxide aqueous solution (concentration 2.38 wt. %) to obtain developed pattern 208 (see FIG. 2(b)).

Figure 2:
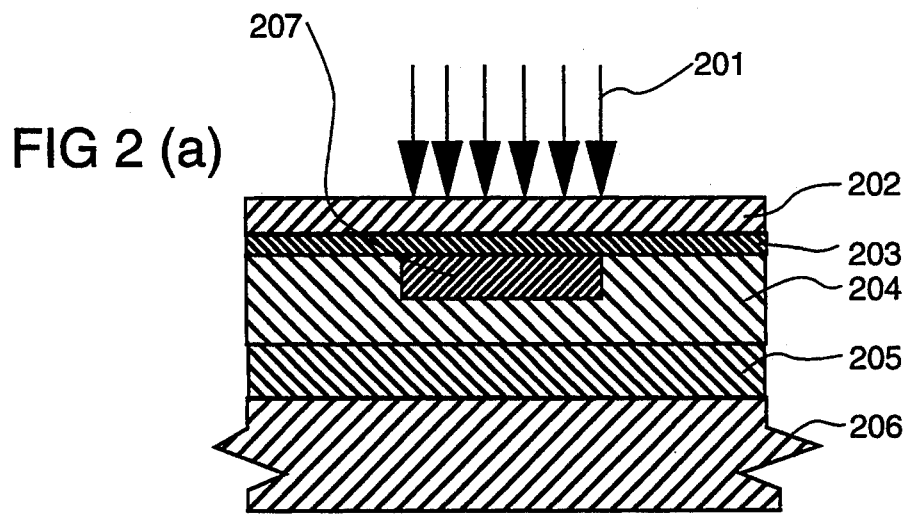
FIGS. 2(a)-2(e) is a process sectional view of Embodiment 2 of the present invention for forming a wiring layer of a silicon semiconductor device by using deep ultraviolet radiation from a KrF excimer laser source of wavelength 248 nm.
Figure 2:
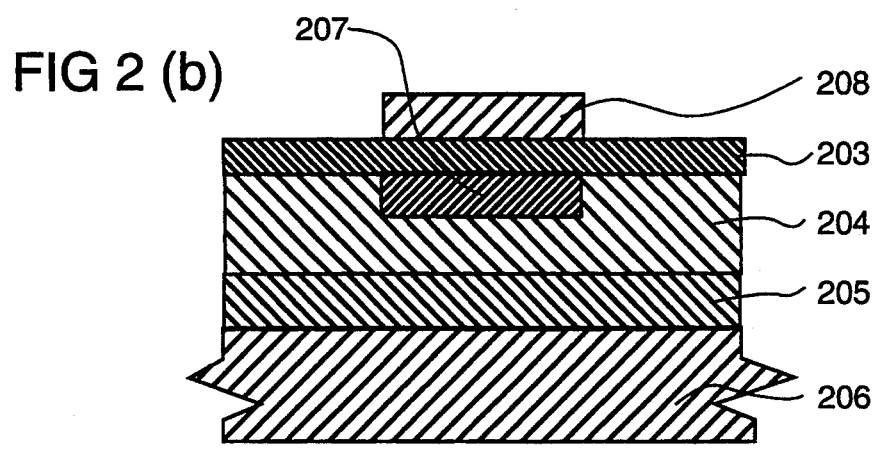
Figure 2:
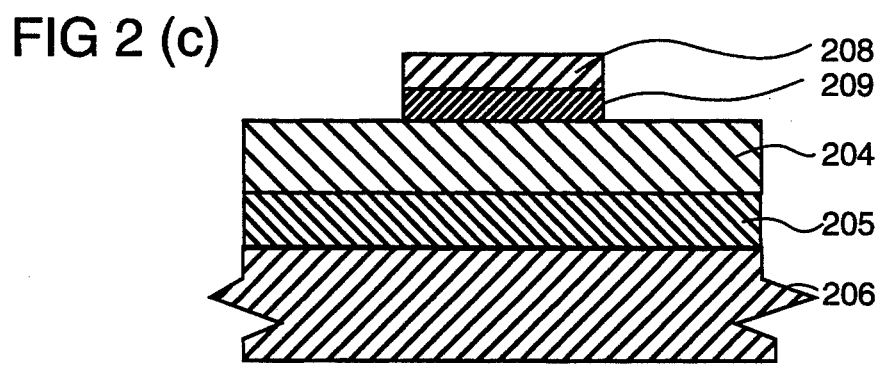
Figure 2:
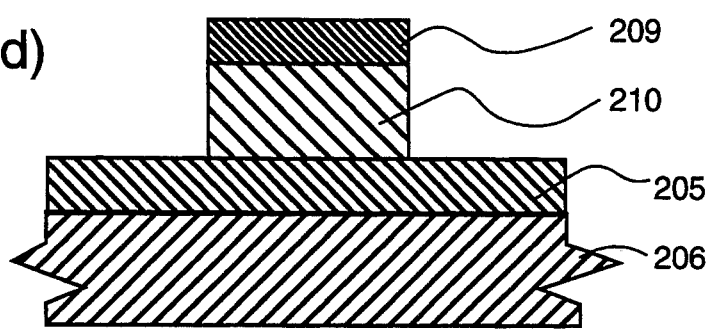
Figure 2:
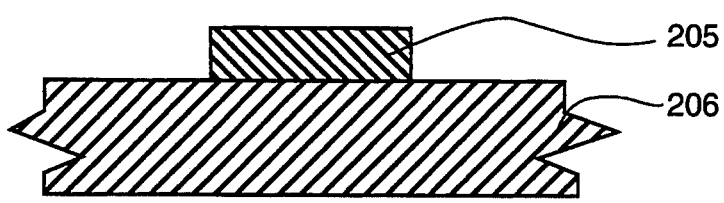

Thereafter, the intermediate layer 203 and bottom resist layer (catalyst generation layer) 204 were removed by dry-etching with a fluorine plasma using pattern 208 as an etching mask, and by oxygen reactive ion etching using intermediate pattern 209 as a mask, respectively, to obtain organic resin resist pattern 210, as shown in FIG. 2(d). Finally, aluminum wiring layer 205 was dry-etched using the resist pattern as a mask, to form a fine wiring pattern having a good aspect ratio.

EMBODIMENT 3

Embodiment 3 will be described with reference to FIGS. 3(a)-3(d), in which the lithography of the present invention was applied to a process for forming a wiring layer of a silicon semiconductor device using a deep ultraviolet ray exposure technique. The radiation source was an ArF excimer laser of wavelength 193 nm. In this embodiment, catalyst generation layer 302 and latent image formation layer 303 were both formed before the actinic radiation, with the catalyst generation layer 302 again being formed on latent image formation layer 303.

After a polyimide film of thickness 1.5 μm was formed as an insulator layer 305 on silicon semiconductor substrate 306, it was coated with coating glass and baked at 200° C. for six minutes to form etching mask layer 304, of thickness 0.1 μm. Etching mask layer 304 was then coated with a solution made by dissolving a composition of about 20 wt. % solid concentration comprising 80 parts by weight of cresol novolak resin and 20 parts by weight of 1,4-bishydroxyisopropylbenzene in cyclohexanone in accordance with a spin-coating method. The sample was then baked at 80° C. for ten minutes to form a latent image formation layer 303 having a thickness of 0.3 μm.

Following the baking step, latent image formation layer 303 was coated with a solution made by dissolving a composition of about 5 wt. % solid concentration comprising 80 parts by weight of polystyrene and 20 parts by weight of di-t-butylphenyliodonium trifluoromethanesulfonate in xylene by using a spin-coating method. Then, the sample was baked at 80° C. for ten minutes more to form a catalyst generation layer 302 having a thickness of 0.1 μm.

Following this baking step, deep ultraviolet radiation 301 was applied to the catalyst generation layer 302 from the ArF excimer laser stepper to activate a catalyst in catalyst generating portion 307 of catalyst generation layer 302 in accordance with a predetermined pattern. In this case, the quantity of irradiation of deep ultraviolet rays was 15 mJ/cm$^2$ (see FIG. 3(a)).

Thereafter, the sample was baked at 90° C. for ten minutes to diffuse the catalyst from catalyst generating portion 307 into latent image formation layer 303 to accelerate the latent image forming reaction in latent image formation layer 303. Accordingly, a latent image corresponding to the pattern was formed in latent image formation layer 303. The sample was then dipped in xylene to remove catalyst generation layer 302, and latent image formation layer 303 was developed using a tetramethylammonium hydroxide aqueous solution (concentration 2.38 wt. %) to obtain developed pattern 308, as shown in FIG. 3(b).

Figure 3:
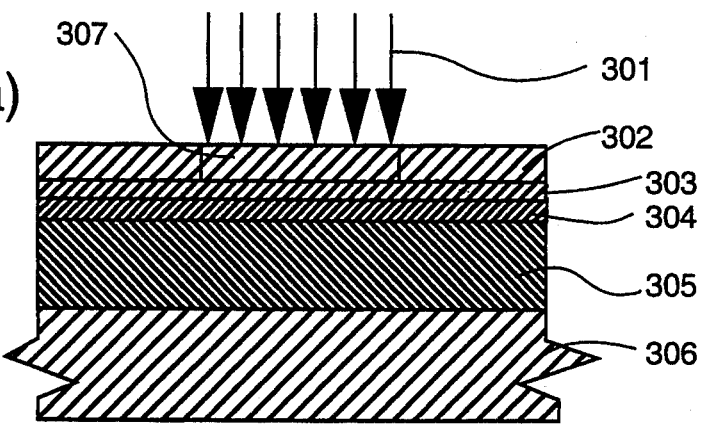
FIGS. 3(a)-3(d) is a process sectional view of Embodiment 3 of the present invention for forming an insulator layer of a silicon semiconductor device by using deep ultraviolet radiation from an ArF excimer laser source of wavelength 193 nm.
Figure 3:
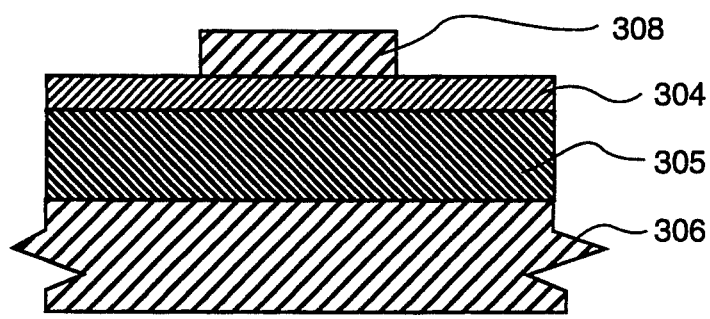
Figure 3:
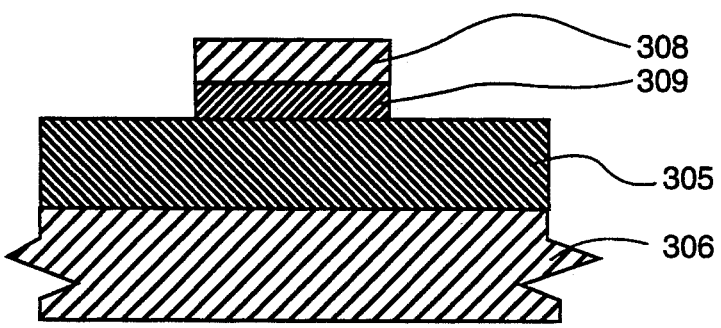
Figure 3:
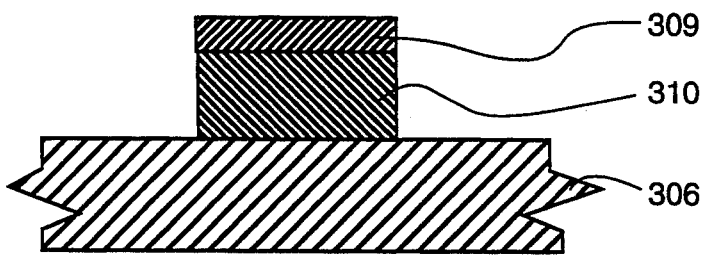

Etching mask layer 304 was then dry-etched using a chlorine plasma to form etching mask pattern 309 in accordance with developed pattern 308 (see FIG. 3(c). Finally, insulator layer 305 was dry-etched by an oxygen reactive ion etching method with mask pattern 309 as an etching mask. The resulting fine insulator pattern 310 had a good aspect ratio (see FIG. 3(d)).

EMBODIMENT 4

Embodiment 4 will be described with reference to FIGS. 4(a)-4(e), in which the lithography of the present invention was applied to a process for forming a wiring layer of a silicon semiconductor device using a bottom resist layer comprising a silicon dioxide film formed through a chemical vapor deposition (CVD) method. In this embodiment, catalyst generation layer 403 and latent image formation layer 402 were both formed before the actinic radiation, but the catalyst generation layer 403 was formed on the latent image formation layer 402.

Figure 4:
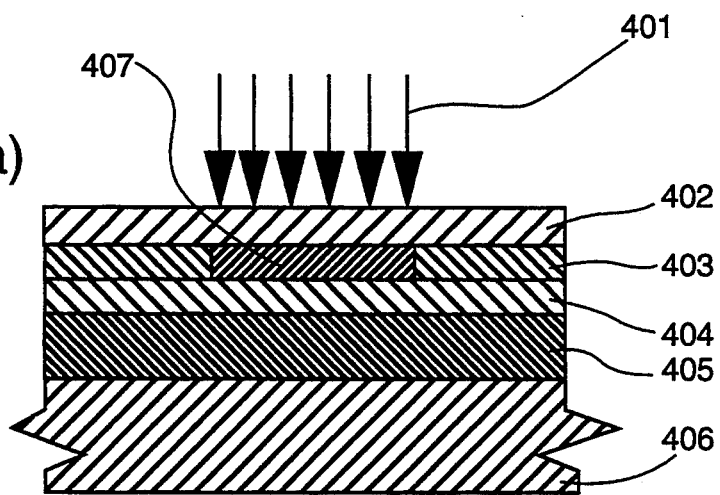
FIGS. 4(a)-4(e) is a process sectional view of Embodiment 4 of the present invention for forming a wiring layer of a silicon semiconductor device by using a silicon dioxide film as a bottom resist layer, the silicon dioxide film being formed using a CVD method.
Figure 4:
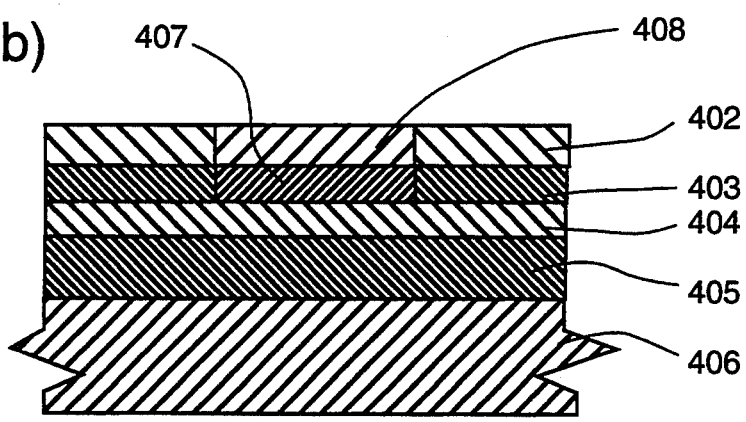
Figure 4:
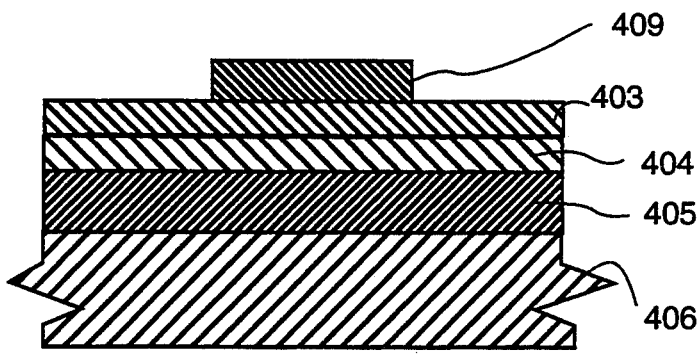
Figure 4:
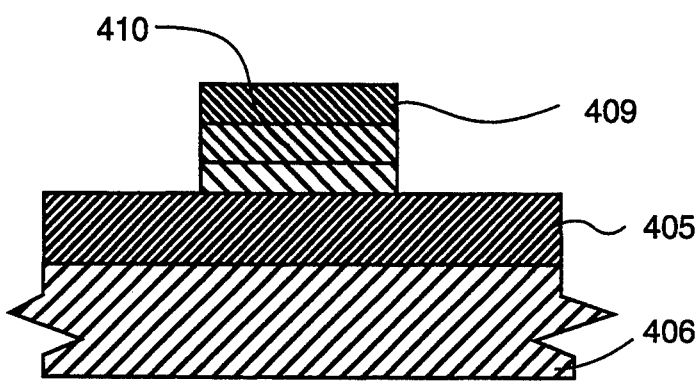
Figure 4:
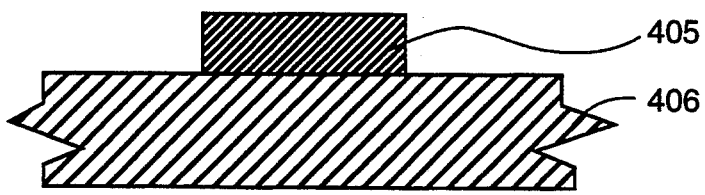

As shown in FIG. 4(a), a tungsten film 405 of thickness 0.5 μm was formed as a wiring layer on a silicon semiconductor substrate 406. Bottom resist layer 404 comprising a silicon dioxide film having a thickness of 0.2 μm was deposited by CVD on tungsten film 405. Thereafter, triphenylsulfonium triflate was added to a methanol solution of coating glass to prepare a composition in which the amount of salt was 5 wt. % in a film state. This composition was applied to the bottom resist layer 404 by a spin-coating method and baked at 180° C. for ten minutes to form catalyst generation layer 403 of thickness 0.15 μm.

The sample was then coated with a solution made by dissolving a composition of 20 wt. % solid concentration comprising 80 parts by weight of cresol novalak resin and 20 parts by weight of 1,4-bishydroxyisopropylbenzene in cyclohexanone by using a spin-coating method, and baked at 80° C. for ten minutes to form a latent image formation layer 402 having a thickness of 0.3 μm. Actinic radiation 401 in the form of an electron beam was then applied to the latent image formation layer 402 using an electron beam drawing apparatus to draw a predetermined wiring pattern. A catalyst was thereby generated in a catalyst generating portion 407 of catalyst generation layer 403 in accordance with the predetermined pattern. The electron beam was provided with an acceleration voltage of 30 kV, and exposure was set to 2 microcoulombs/cm$^2$.

The sample was then baked at 90° C. for ten minutes to diffuse the catalyst into the latent image formation layer 402 from the catalyst generating portion 407, to accelerate the latent image forming reaction in the latent image formation layer 402 so that a latent image 408 corresponding to the pattern shape was formed. See FIG. 4(b).

The latent image was then developed using a tetramethylammonium hydroxide aqueous solution (concentration 2.38 wt. %) to obtain a developed pattern 409, as shown in FIG. 4(c). Catalyst generation layer 403 and lower resist layer 404 were then subjected to fluorine reactive ion etching using the developed pattern 409 as an etching mask to obtain a resist pattern 410, as shown in FIG. 4(d).

Finally, aluminum wiring layer 405 was dry-etched with an etching medium including a chlorine plasma, using the resist pattern 410 as a mask. Hence, a fine wiring pattern of a satisfactory aspect ratio was formed, as shown in FIG. 4(e).

EMBODIMENT 5

Embodiment 5 will be described with reference to FIGS. 5(a)-5(e), in which the lithography of the present invention was applied to a process for forming a wiring layer of a silicon semiconductor device using soft X-rays of a wavelength of approximately 100 Å emitted from a synchrotronorbit radiation source. In this embodiment, the latent image formation layer 507 was formed after application of the actinic radiation.

Aluminum film 504 having a thickness of 0.7 μm was formed as a wiring layer on a silicon semiconductor substrate 505. After formation, aluminum wiring layer 504 was coated with resist material RU-3900B (an industrial product made by Hitachi Chemical Co., Ltd.) and baked at 180° C. for five minutes to form a bottom resist layer 503 having a thickness of 1.6 μm.

Then, bottom resist layer 503 was coated with a solution made by dissolving a composition of about 7 wt. % solid concentration comprising 80 parts by weight of cresol novalak resin, 15 parts by weight of 3-substituted ester of trihydroxybenzophenone and o-naphtoquinonediazidosulfonic acid as a thermal cross-linking agent, and 5 parts by weight of triphenylsulfonium triflate in 2-ethoxyethyl acetate by using a spin-coating method. The sample was then baked at 180° C. for ten minutes to form catalyst generation layer 502 of thickness 0.15 μm.

The soft X-rays of wavelength 100 Å, approximately, were then applied using a synchrotron-orbit radiation source, thus activating a catalyst in the catalyst generation layer in accordance with a predetermined wiring pattern. In this case, the intensity of the soft X-ray exposure was 50 mJ/cm$^2$. See FIG. 5(a).

Then, the catalyst generation layer 502 was coated with a solution made by dissolving a composition of about 20 wt. % solid concentration comprising 90 parts by weight of polyhydroxybenzylsilsesquioxane of an alkali-soluble silicon resin, and 10 parts by weight of diphenyl-silanediol in 2-ethoxyethyl acetate by using a spin-coating method to form a latent image formation layer 507 of thickness 0.3 μm. The sample was then baked at 90° C. for ten minutes to diffuse the catalyst from the catalyst generating portion 506 into the latent image formation layer 507 to accelerate the latent image-forming reaction corresponding to the patterned shape, thereby forming latent image 508, as shown in FIG. 5(b).

Figure 5:
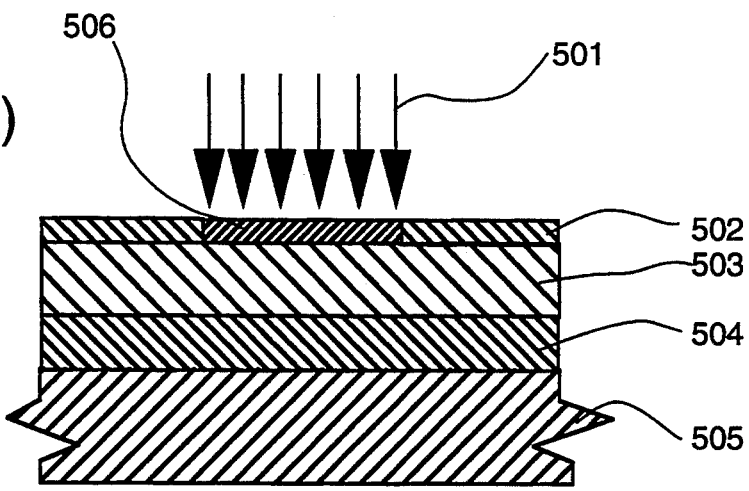
FIGS. 5(a)-5(e) is a process sectional view of Embodiment 5 of the present invention for forming a wiring layer of a silicon semiconductor device by using soft X-rays having a wavelength of approximately 100 Å from a synchrotron-orbit radiation source.
Figure 5:
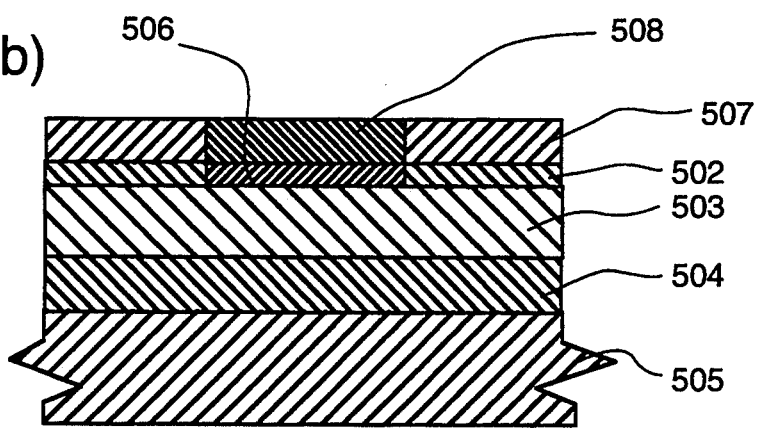
Figure 5:
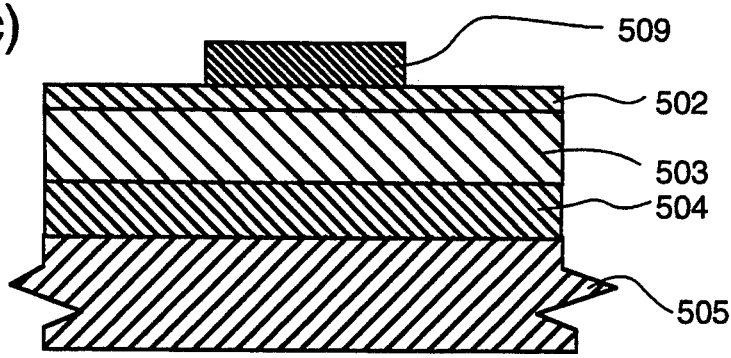
Figure 5:
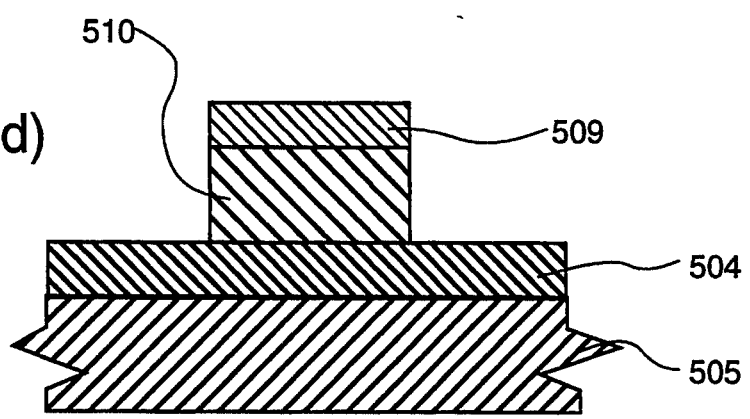
Figure 5:
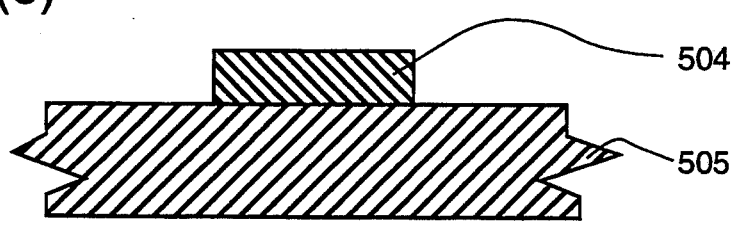

Thereafter, latent image formation layer 507 was developed by using a tetramethylammonium hydroxide aqueous solution (concentration 1.5 wt. %) to obtain a developed pattern 509, as shown in FIG. 5(c). Then, catalyst generation layer 502 and lower resist layer 503 were subjected to oxygen reactive ion etching by using the developed pattern 509 as an etching mask, to obtain an organic resin resist pattern 510. See FIG. 5(d).

Finally, aluminum wiring layer 504 was dry etched, as shown in FIG. 5(e), by using the resist pattern 510 as an etching mask. Hence, a fine wiring pattern having a satisfactory aspect ratio was formed.

EMBODIMENT 6

Embodiment 6 utilized an electron beam as well as deep ultraviolet radiation from a KrF excimer laser source of wavelength 248 nm in combination was the actinic radiation. The deep ultraviolet radiation had the same parameters as the actinic radiation of Embodiment 1. Patterns having line widths of 0.5 μm or less were thus drawn by the electron beam, and those with line widths greater than 0.5 μm were exposed using the deep ultraviolet radiation.

Further, in this embodiment, an aluminum wiring layer was formed on a semiconductor substrate more quickly than occurred in Embodiment 1, but the aluminum wiring layer of this embodiment has a similarly satisfactory aspect ratio in comparison with that of Embodiment 1.

According to the present invention, the mask pattern latent image is not influenced by the exposure profile. Therefore, the difference of the exposure profile in the film thickness direction due to the difference of radiation quality does not directly influence the mask pattern latent image even if a plurality of actinic radiation sources having different qualities (such as in Embodiment 6) are utilized. Therefore, etching patterns having the same high quality can be formed.

The surface imaging method according to the present invention can be realized with a simple apparatus. Moreover, the method enjoys high flexibility because it can be applied to the etching of various substrate materials. Therefore, it is possible to realize microfabrication of high-integration semiconductor devices accurately and efficiently.

Various modifications of the foregoing invention will become apparent to those of ordinary skill in the art. All such modifications that basically rely upon the teachings through which the present invention have advanced the state of the art are properly considered within the spirit and scope of the following claims.

We claim:

1. A method for forming a mask pattern for an electronic device, comprising the steps of:
   providing a substrate;
   providing a first layer on said substrate;
   providing a second layer on said first layer;
   providing a third layer including a catalyst precursor on said second layer;
   irradiating said third layer in accordance with a predetermined pattern to cause said catalyst precursor to produce a catalyst; and
   heating said second and third layers to diffuse said catalyst into said second layer to cause a latent image to form in said second layer in accordance with the predetermined pattern.

2. A method for forming a mask pattern as claimed in claim 1, wherein said catalyst precursor is an acid generator.

3. A method for forming a mask pattern as claimed in claim 1, wherein said second layer includes an organic resin.

4. A method for forming a mask pattern as claimed in claim 1, wherein the irradiating step is performed using soft X-rays.

5. A method for forming a mask pattern as claimed in claim 1, wherein said irradiating step is performed using at least two different species of actinic radiation.

6. A method for forming a mask pattern as claimed in claim 5, wherein said at least two different species of actinic radiation are irradiated simultaneously.

7. A method for forming a mask pattern as claimed in claim 5, wherein said at least two different species of actinic radiation are irradiated sequentially.

8. A method for forming a mask pattern for an electronic device, comprising the steps of:
   providing a substrate;
   providing a first layer;
   providing a second layer including a catalyst precursor on said first layer;
   providing a third layer on said second layer;
   irradiating said second layer in accordance with a predetermined pattern to cause said catalyst precursor to produce a catalyst; and
   heating said second and third layers to diffuse said catalyst into said third layer to cause a latent image to form in said third layer in accordance with said predetermined pattern.

9. A method for forming a mask pattern as claimed in claim 8, wherein said catalyst precursor is an acid generator.

10. A method for forming a mask pattern as claimed in claim 8, wherein said second layer includes an acid precursor capable of producing an acid upon irradiation by actinic radiation during the irradiating step.

11. A method for forming a mask pattern as claimed in claim 8, further comprising the step of providing a diffusion interface layer between said second and third layers.

12. A method for forming a mask pattern as claimed in claim 8, wherein said third layer-producing step is performed after said irradiating step.

13. A method for forming a mask pattern as claimed in claim 8, wherein said irradiating step is performed after said third layer-producing step.

14. A method for forming a mask pattern as claimed in claim 8, wherein said irradiating step is performed using at least two different species of actinic radiation.

15. A method for forming a mask pattern as claimed in claim 14, wherein said at least two different species of actinic radiation are irradiated simultaneously.

16. A method for forming a mask pattern as claimed in claim 14, wherein said at least two different species of actinic radiation are irradiated sequentially.

17. A method for manufacturing an electronic device, comprising the steps of:
   providing a substrate;
   providing a first layer on said substrate;
   providing a second layer on said first layer;
   providing a third layer including a catalyst precursor on said second layer;
   irradiating said third layer in accordance with a predetermined pattern to cause said catalyst precursor to produce a catalyst;
   heating said second and third layers to diffuse said catalyst into said second layer to cause a latent image to form in said second layer in accordance with the predetermined pattern;
   removing said third layer;
   developing said second layer in accordance with said predetermined pattern; and
   etching said first layer in accordance with said predetermined pattern.

18. A method for manufacturing an electronic device as claimed in claim 17, wherein said catalyst precursor is an acid generator.

19. A method for manufacturing an electronic device as claimed in claim 17, wherein said second layer includes an organic resin.

20. A method for manufacturing an electronic device as claimed in claim 17, wherein the irradiating step is performed using soft X-rays.

21. A method for manufacturing an electronic device as claimed in claim 17, wherein said irradiating step is performed using at least two different species of actinic radiation.

22. A method for manufacturing an electronic device as claimed in claim 21, wherein said at least two different species of actinic radiation are irradiated simultaneously.

23. A method for manufacturing an electronic device as claimed in claim 21, wherein said at least two different species of actinic radiation are irradiated sequentially.

24. A method for manufacturing an electronic device as claimed in claim 17, wherein said first layer is an electrical conductor.

25. A method for manufacturing an electronic device as claimed in claim 17, wherein said first layer is an electrical insulator.

26. A method for manufacturing an electronic device, comprising the steps of:
   providing a substrate;
   providing a first layer;
   providing a second layer including a catalyst precursor on said first layer;
   providing a third layer on said second layer;
   irradiating said second layer in accordance with a predetermined pattern to cause said catalyst precursor to produce a catalyst;
   heating said second and third layers to diffuse said catalyst into said third layer to cause a latent image to form in said third layer in accordance with said predetermined pattern;

developing said third layer in accordance with said predetermined pattern;

removing said second layer in accordance with said predetermined pattern; and etching said first layer in accordance with said predetermined pattern.

27. A method for manufacturing an electronic device as claimed in claim 26, wherein said catalyst precursor is an acid generator.

28. A method for manufacturing an electronic device as claimed in claim 26, wherein said second layer includes an acid precursor capable of producing an acid upon irradiation by actinic radiation during the irradiating step.

29. A method for manufacturing an electronic device as claimed in claim 26, further comprising the step of providing a diffusion interface layer between said second and third layers.

30. A method for manufacturing an electronic device as claimed in claim 26, wherein said third layer-producing step is performed after said irradiating step.

31. A method for manufacturing an electronic device as claimed in claim 26, wherein said irradiating step is performed after said third layer-producing step.

32. A method for manufacturing an electronic device as claimed in claim 26, wherein said irradiating step is performed using at least two different species of actinic radiation.

33. A method for manufacturing an electronic device as claimed in claim 32, wherein said at least two different species of actinic radiation are irradiated simultaneously.

34. A method for manufacturing an electronic device as claimed in claim 32, wherein said at least two different species of actinic radiation are irradiated sequentially.

35. A method for manufacturing an electronic device as claimed in claim 26, wherein said first layer is an electrical conductor.

36. A method for manufacturing an electronic device as claimed in claim 26, wherein said first layer is an electrical insulator.

37. A method for forming a mask pattern for a device, comprising the steps of:

providing a substrate;

providing a first layer, including a catalyst precursor, and, a second layer, in which a latent image is to be formed, on said substrate in any order;

irradiating said first layer in accordance with a predetermined pattern to cause said catalyst precursor to produce a catalyst;

forming the latent image in said second layer by diffusing said catalyst into said second layer in accordance with the predetermined pattern; and developing said second layer in accordance with the predetermined pattern.

* * * * *